United States Patent
Chang et al.

(10) Patent No.: US 11,967,615 B2
(45) Date of Patent: Apr. 23, 2024

(54) DUAL THRESHOLD VOLTAGE (VT) CHANNEL DEVICES AND THEIR METHODS OF FABRICATION

(71) Applicant: Intel Corporation, Santa Clara, CA (US)

(72) Inventors: Hsu-Yu Chang, Hillsboro, OR (US); Neville L. Dias, Hillsboro, OR (US); Walid M. Hafez, Portland, OR (US); Chia-Hong Jan, Portland, OR (US); Roman W. Olac-Vaw, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,536

(22) PCT Filed: Dec. 23, 2015

(86) PCT No.: PCT/US2015/000506
§ 371 (c)(1),
(2) Date: May 3, 2018

(87) PCT Pub. No.: WO2017/111874
PCT Pub. Date: Jun. 29, 2017

(65) Prior Publication Data
US 2018/0323260 A1 Nov. 8, 2018

(51) Int. Cl.
*H01L 29/10* (2006.01)
*H01L 21/265* (2006.01)
(Continued)

(52) U.S. Cl.
CPC .... *H01L 29/1054* (2013.01); *H01L 21/26506* (2013.01); *H01L 21/26586* (2013.01);
(Continued)

(58) Field of Classification Search
CPC ......... H01L 29/66636; H01L 29/66659; H01L 21/823814; H01L 29/1054;
(Continued)

(56) References Cited

U.S. PATENT DOCUMENTS

| 6,190,975 B1 * | 2/2001 | Kubo ................... H01L 21/8238 257/E29.05 |
| 2002/0033511 A1 * | 3/2002 | Babcock ......... H01L 21/823814 257/E29.054 |

(Continued)

OTHER PUBLICATIONS

International Preliminary Report on Patentability for PCT Patent Application No. PCT/US2015/000506 dated Jul. 5, 2018, 12 pgs.
(Continued)

*Primary Examiner* — Ermias T Woldegeorgis
(74) *Attorney, Agent, or Firm* — Schwabe, Williamson & Wyatt, P.C.

(57) ABSTRACT

Embodiments of the present invention are directed to dual threshold voltage (VT) channel devices and their methods of fabrication. In an example, a semiconductor device includes a gate stack disposed on a substrate, the substrate having a first lattice constant. A source region and a drain region are formed on opposite sides of the gate electrode. A channel region is disposed beneath the gate stack and between the source region and the drain region. The source region is disposed in a first recess having a first depth and the drain region disposed in a second recess having a second depth. The first recess is deeper than the second recess. A semiconductor material having a second lattice constant different than the first lattice constant is disposed in the first recess and the second recess.

10 Claims, 9 Drawing Sheets

(51) Int. Cl.
  *H01L 29/66* (2006.01)
  *H01L 29/78* (2006.01)
  *H01L 29/161* (2006.01)
  *H01L 29/165* (2006.01)
(52) U.S. Cl.
  CPC .. *H01L 29/66545* (2013.01); *H01L 29/66636* (2013.01); *H01L 29/66659* (2013.01); *H01L 29/7848* (2013.01); *H01L 29/161* (2013.01); *H01L 29/165* (2013.01)
(58) Field of Classification Search
  CPC ......... H01L 21/26506; H01L 21/26586; H01L 29/66545; H01L 29/7848; H01L 29/161; H01L 29/165
  See application file for complete search history.

(56) References Cited

U.S. PATENT DOCUMENTS

| | | | |
|---|---|---|---|
| 2003/0116792 A1* | 6/2003 | Chen | H01L 29/165 257/E29.085 |
| 2004/0004247 A1 | 1/2004 | Forbes et al. | |
| 2006/0043498 A1* | 3/2006 | Orlowski | H01L 29/66659 257/E29.268 |
| 2006/0186484 A1* | 8/2006 | Chau | H01L 29/7848 438/300 |
| 2009/0134475 A1 | 5/2009 | Min | |
| 2011/0073961 A1* | 3/2011 | Dennard | H01L 29/7848 257/408 |
| 2012/0129311 A1* | 5/2012 | Pal | H01L 29/7848 438/303 |
| 2013/0175545 A1* | 7/2013 | Flachowsky | H01L 29/1608 257/E21.409 |
| 2013/0214357 A1* | 8/2013 | Chang | H01L 29/0657 438/151 |
| 2014/0091371 A1* | 4/2014 | Son | H01L 29/66659 257/288 |
| 2015/0236157 A1 | 8/2015 | Kwok et al. | |

OTHER PUBLICATIONS

International Search Report and Written Opinion for International Patent Application No. PCT/US2015/000506 dated Sep. 22, 2016, 15 pgs.

Office Action from Taiwan Patent Application No. 105138280, dated May 4, 2020 24 pages.

Notice of Allowance from Taiwan Patent Application No. 105138280, dated Feb. 3, 2021, 3 pages.

* cited by examiner

DUAL THRESHOLD VOLTAGE (VT) CHANNEL DEVICES AND THEIR METHODS OF FABRICATION

CROSS-REFERENCE TO RELATED APPLICATION

This patent application is a U.S. National Phase Application under 35 U.S.C. § 371 of International Application No. PCT/US2015/000506, filed Dec. 23, 2015, entitled "DUAL THRESHOLD VOLTAGE (VT) CHANNEL DEVICES AND THEIR METHODS OF FABRICATION," which designates the United States of America, the entire disclosure of which is hereby incorporated by reference in its entirety and for all purposes.

BACKGROUND

1. Field

Embodiments of the present invention are related to the field of semiconductor devices and their methods of fabrication.

2. Discussion of Related Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a chip, lending to the fabrication of products with increased capacity. The drive for ever-more capacity, however, is not without issue. The necessity to optimize the performance of each device becomes increasingly significant.

Another trend in the semiconductor industry is to consider system-on-a-chip type architectures. Such architectures may incorporate, for example, analog devices, logic devices, or both. As such devices are scaled smaller short channel effects, such as drain induced barrier leakage (DIBL), can detrimentally impact device performance. Furthermore, channel engineering and/or source and drain engineering is being realized as an important factor in the fabrication of such semiconductor devices.

However, improvements are need in the mitigation of short channel effects, and in the engineering of channel and/or source and drain behavior of semiconductor devices.

DESCRIPTION OF THE EMBODIMENTS

Figure 1A:
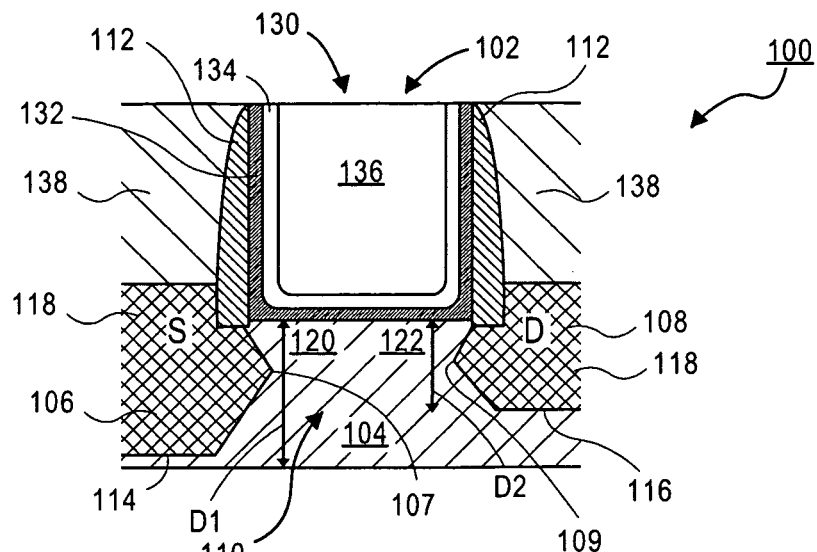
FIG. 1A is an illustration of a cross-sectional view of a dual VT device having asymmetric source and drain regions in accordance with embodiments of the present invention.

Embodiments of the present invention are directed to dual threshold voltage (VT) channel devices and their methods of fabrication. In the following description numerous specific details are set forth in order to provide a thorough understanding of embodiments of the present invention. In other instances, well-known semiconductor device concepts and techniques have not been described in particular detail in order to not unnecessarily obscure embodiments the present invention.

In an embodiment of the present invention, a dual threshold voltage (VT) channel device has a first higher threshold voltage near the source side of the channel and a second lower threshold voltage near the drain side of the channel. The VT variation along the channel induces different inversion carrier distribution and the same as electric field. The electric field close to the source side is elevated and further enhances device performance, while the electric field close to the drain side is decreased which suppresses short channel effects (I-off leakage). That is, a higher threshold voltage near the source region results in a high electric field (e-field) near the source region which increases the carrier number and velocity near the source which in turn increases the drive current of the device. Additionally, a lower threshold voltage near the drain side of the channel results in a lower e-field near the drain which in turn reduces the off state leakage of the device.

In an embodiment of the present invention, differential strain provided by in the source and drain regions is used to create a high threshold voltage near the source side of the channel and a lower threshold voltage near the drain side of the channel. In an embodiment, a higher amount of channel strain is created by the source region than is created by the drain region. In an embodiment, a deep recess is formed in a substrate on the source side of the gate stack while a shallower recess is formed in the substrate on the drain side of the gate stack. The recesses are then filled with a semiconductor material, such as silicon germanium (SiGe), having a different lattice constant than the substrate, such as a monocrystalline silicon substrate. The deep recess on the source side results in the source region providing more strain to the source side of the channel than is applied by the drain side due to the shallower recess.

In another embodiment of the present invention, a dual VT device may be realized with an asymmetric channel region. In an embodiment, the channel region has a first semiconductor portion adjacent to the source region and a second semiconductor portion adjacent to the drain region. The first semiconductor portion near the source has a larger band gap than the second semiconductor portion near the drain, resulting in a high VT near the source and a lower VT near the drain. For example, in an embodiment, the first portion of the channel near the source region may be a portion of a silicon substrate, while the second portion near the drain may be a silicon germanium alloy created by implanting germanium atoms into the silicon substrate beneath the gate stack on the drain side of the device. In still other embodiments, a combination of asymmetric source and drain region and an asymmetric channel may be utilized to provide greater flexibility in device engineering. The dual VT techniques of the present invention may be utilized to provide semiconductor devices with superior short channel behavior, enhanced performance (e.g., drive current) and increased reliability. The dual VT channel devices of the embodiments of the present invention may be realized as planar devices as well as nonplanar devices, such as FIN-FETs.

FIG. 1A is a cross-sectional illustration of a dual VT channel device 100 having asymmetric source and drain regions. In an embodiment, device 100 includes a gate stack 102 disposed on a semiconductor substrate 104. In one such embodiment, the semiconductor substrate 104 is a monocrystalline silicon substrate. A source region 106 and a drain region 108 are disposed on opposite sides of gate stack 102 as illustrated in FIG. 1A. Device 100 includes a channel region 110 in the substrate 104 beneath gate stack 102 and between source region 106 and drain region 108. A pair of dielectric sidewall spacers 112 may be formed along laterally opposite sidewalls of gate stack 102 as shown in FIG. 1A.

Source region 106 is disposed in a source recess 114 formed in substrate 104 and a drain region 108 is disposed in a drain recess 116 formed in substrate 104. Source recess 114 has a first depth D1, while drain recess 116 has a second shallower depth D2. It is to be appreciated that the depth D1 and D2 are measured from the surface of the substrate 104 upon which the gate stack 102 is disposed. In an embodiment, the depth D1 of source recess 114 is at least 20% deeper than the depth D2 of drain recess 116, and in other embodiments, at least 50% deeper. In an embodiment, the depth D1 of source recess 114 is between 20-70% deeper than the depth D2 of drain recess 116. In an embodiment, source recess 114 and drain recess 116 extend beneath gate stack 102, and in some embodiments further extend beneath a gate electrode 130 of gate stack 102, as illustrated in FIG. 1A. In an embodiment of the present invention, source recess 114 and drain recess 116 may be faceted as illustrated in FIG. 1A. In one such embodiment, the vertex 107 of the facet of the source side is deeper into the substrate than is the vertex 109 of the facet of the drain side, as illustrated in FIG. 1A. In one embodiment, the vertex 107 of the facet of the source side extends further under the gate stack than does the vertex 109 of the facet of the drain side, as also illustrated in FIG. 1A.

In an embodiment, source recess 114 and drain recess 116 are filled with a semiconductor material 118 having a lattice constant which is different than the lattice constant of substrate 104 in order to create a stress in the channel region 110. In an embodiment, semiconductor material 118 fills recesses 114 and 116 and extends above the surface of substrate 104 upon which gate stack 102 is formed in order to create a raised source region 106 and a raised drain region 108 to improve the contact resistance of the device (R-external). In an embodiment of the present invention, the source region 106 and the drain region 108 may be doped to a p type conductivity when fabricating a p type device and may be doped to an n type conductivity when fabricating an n type device.

Because semiconductor 106 is disposed deeper into substrate 104 on the source side than is semiconductor material 118 on the drain side of the device, a larger amount of stress or strain is generated in channel portion 120 near the source region 106 than is generated in channel portion 122 near the drain region 108. In an embodiment, a larger stress in the channel region 120 near the source 106 results in a higher VT in the channel portion 120 near the source 106 and the lower stress in the channel region 122 near the drain 108 results in a lower VT in the channel portion 122 near the drain 108.

In a specific embodiment, substrate 104 is a monocrystalline silicon substrate and semiconductor material 118 is a silicon germanium material which creates a higher amount of compressive stress in channel region 120 near the source region 106 and a lower amount of compressive stress in the channel region 122 near the drain 108. In an embodiment, the silicon germanium material has a concentration of about 20-40 atomic percent germanium.

Figure 1B:
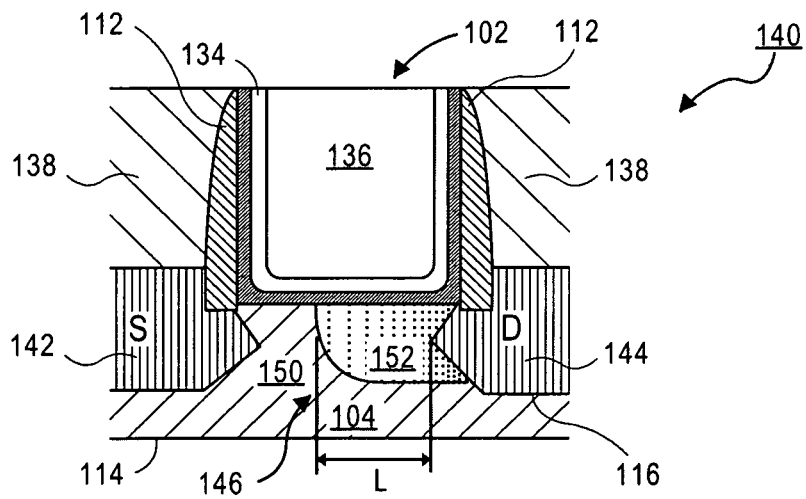
FIG. 1B is an illustration of a cross-sectional view of a dual VT channel device having an asymmetric channel in accordance with embodiments of the present invention.

FIG. 1B is a cross-sectional illustration of a dual VT channel device 140 having an asymmetric channel. In an embodiment, dual VT channel device 140 includes gate stack 102 disposed on a substrate 104 as described above. A source region 142 and a drain region 144 are formed on opposite sides of the gate stack 102. A channel region 146 is disposed in substrate 104 beneath gate stack 102 and between source region 142 and drain region 144. In an embodiment, the channel region 146 includes a first semiconductor channel portion 150 adjacent to source region 142 and a second semiconductor channel portion 152 adjacent to drain region 144. In an embodiment, the second semiconductor channel portion 152 adjacent to drain region 144 has a smaller band gap than the band gap of the first semiconductor channel portion 150 adjacent to the source region 142. In an embodiment, the band gap of the second semiconductor channel portion 152 is at least 50 meV, and, ideally at least 100 meV less than the band gap of the first semiconductor channel portion 150. In embodiments of the present invention, the first semiconductor channel portion 150 is silicon and the second semiconductor channel portion 152 is silicon germanium. In a particular embodiment, the first semiconductor channel portion 150 is a portion of a silicon monocrystalline substrate 104 while the second semiconductor channel portion 152 is a germanium-containing portion of the silicon monocrystalline substrate 104. In a specific embodiment, the germanium-containing portion includes between 10-30 atomic percent germanium. In an embodiment, the second semiconductor channel portion 152 is a graded portion having a highest concentration of band gap lowering atoms closest to the drain region 144, and a lower concentration of the band gap lowering atoms closest to the first semiconductor channel portion 150.

In an embodiment, the second semiconductor channel portion 152 has a length (L) which is between 20-50% of the channel length of the device wherein the channel length is defined as the length of the gate electrode along the direction of carrier transport. In an embodiment, the second semiconductor channel portion is formed to a depth which is at least the depth at which the inversion (inversion depth) occurs in the channel region when the device is turned "ON". In an embodiment, the semiconductor channel portion extends to a depth from the surface of the substrate on which gate stack 102 is formed of at least 20 nm, and in particular embodiments, between 20-40 nm. In an embodiment, semiconductor channel portion 152 extends to a depth which is less than the depth at which drain region 144 extends into substrate 104.

Source region 142 and drain region 144 may be formed by ion implanting dopants, such as p type or n type dopants into substrate 104. In other embodiments, source region 142 and drain region 144 may be formed by etching recesses into substrate 104 and then filling the recesses with semiconductor material, such as SiGe. In an embodiment, source region 142 and drain region 144 extend the same depth into substrate 104 as illustrated in FIG. 1B.

Figure 1C:
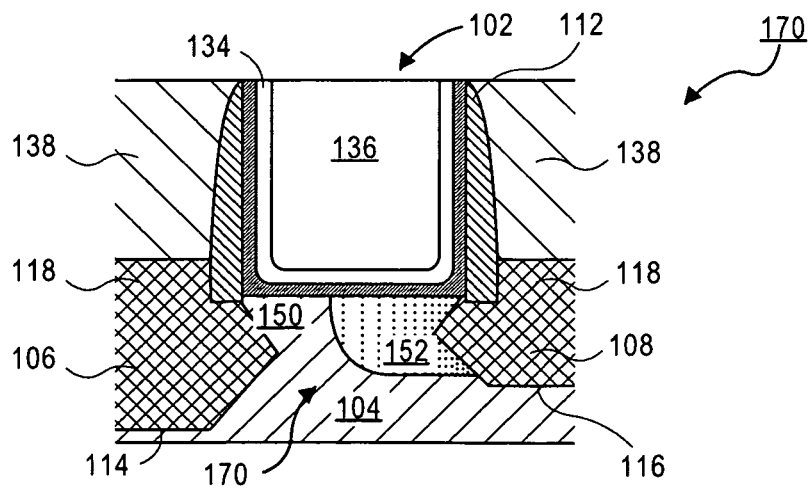
FIG. 1C is an illustration of a cross-sectional view of dual VT channel device having asymmetric source and drain region as well as an asymmetric channel in accordance with embodiments of the present invention.

FIG. 1C is an illustration of a dual VT device 170 which includes a combination of asymmetric source and drain regions and an asymmetric channel region. Dual VT device 170 may include gate stack 102 disposed on substrate 104 as described above. Dual VT device 170 includes a source region 106 and a drain region 108 disposed on opposite sides of the gate stack 102. A channel region 170 is disposed beneath gate stack 102 and between source region 106 and drain region 108.

As described above with respect to FIG. 1A, source region 106 includes a deep recess 114 filled with a stressing semiconductor material 118 and drain region 108 includes shallower recess 116 filled with stressing semiconductor material 118 to provide differential strain to the channel region 170 where the deep source region 106 provides a larger strain to the channel region 170 adjacent to the source region 106 inducing a high VT in the channel 170 near the source region 106, while the shallower drain region 108 provides a lower stress 170 near the drain 108 to induce a lower VT in the channel region 170 near the drain 108.

Dual VT channel device 170 also includes a first semiconductor channel portion 150 adjacent to the source region 106 and a second semiconductor channel portion 152 adjacent to the drain 108 where the second semiconductor channel portion 152 has a lower band gap than the first semiconductor channel portion 150 as described above. In an embodiment, second semiconductor channel portion 152 extends a depth into substrate 104 which is approximately equal to the depth at which drain recess 116 extends into substrate 104. In an embodiment, the second semiconductor channel portion 152 is a graded portion having a highest concentration of band gap lowering atoms closest to the drain region 108, and a lower concentration of the band gap lowering atoms closest to the first semiconductor channel portion 150. Since dual VT device 170 includes both asymmetric source and drain regions as well as an asymmetric channel, greater freedom and flexibility is provided for designing semiconductor devices with desired electrical characteristics and functionality.

In embodiments of the invention substrate 104 may be a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

In an embodiment, gate stack 102 is formed of at least two layers, a gate electrode layer 130 and a gate dielectric layer 132. The gate dielectric layer 132 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer 130 is formed on the gate dielectric layer 132 and may include at least one P-type workfunction metal or N-type workfunction metal, depending on whether the transistor is to be a P-type or an N-type transistor. In some implementations, the gate electrode layer 130 may consist of a stack of two or more metal layers, where one or more metal layers are workfunction metal layers 134 and at least one metal layer is a fill metal layer 136.

For a P-type transistor, metals that may be used for the gate electrode include, but are not limited to, ruthenium, palladium, platinum, cobalt, nickel, and conductive metal oxides, e.g., ruthenium oxide. A P-type metal layer will enable the formation of a P-type gate electrode with a workfunction that is between about 4.9 eV and about 5.2 eV. For an N-type transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an N-type gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Sidewall spacers 112 may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

One or more interlayer dielectrics (ILD) 138 are deposited over the semiconductor device. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Metal layers formed in the ILD may be used to electrically interconnect various semiconductor devices such as dual VT devices 100, 140 and 170 formed on substrate 104 into functional integrated circuits, such as but not limited to, microprocessors and memories.

Figure 2A:
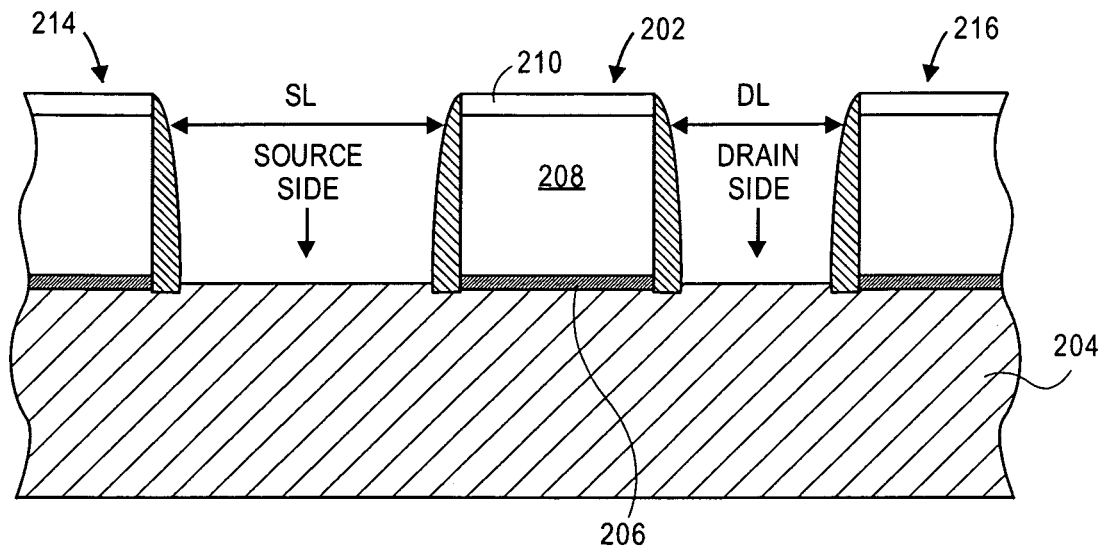
FIGS. 2A-2D illustrates a method of fabricating a dual VT channel device having asymmetric source and drain regions.

FIGS. 2A-2D illustrate a method of fabricating a dual VT semiconductor device having asymmetric source and drain regions in accordance with embodiments of the present invention. The process may begin by forming a sacrificial gate stack 202 on a substrate 204. Sacrificial gate stack 202 may include a lower sacrificial gate dielectric 206 and a sacrificial gate electrode 208. Additionally, sacrificial gate stack 202 may include a hard mask 210 formed on sacrificial gate electrode 208. Sacrificial gate dielectric 206 may be an oxide and sacrificial gate electrode 208 may be polycrystalline silicon or silicon germanium, for example. In embodiments, hard mask 210 may be silicon nitride. A pair of insulating spacers 212 may be formed along laterally opposite sidewalls of gate stack 202 as shown in FIG. 2A.

A source side structure 214 may be formed on substrate 204 on the source side of gate stack 202 and spaced apart from gate stack 202 by a distance (SL). In a similar manner, a drain side structure 216 may be formed on substrate 204 on the drain side of gate stack 202 and spaced apart from gate stack 202 by a distance (DL). In an embodiment, source side structure 214 and drain side structure 216 may be sacrificial gate electrodes or dummy gate electrodes. Alternatively, they may be a masking material, such as photoresist. Source side structure 214 is separated by a larger distance from sacrificial gate structure 202 than is drain side structure 216, i.e., SL>DL. In an embodiment, gate side structure 214 is separated from sacrificial gate stack 202 by a greater distance than drain side structure 216 is separated from gate stack 202 in order to create a greater etch rate of substrate 204 on the source side than on the drain side. In an embodiment of the present invention, source side structure 214 is separated from sacrificial gate stack 202 by a distance (SL) which is at least 30% larger than the distance (DL) which drain side structure 216 is separated from sacrificial gate structure 202.

Figure 2B:
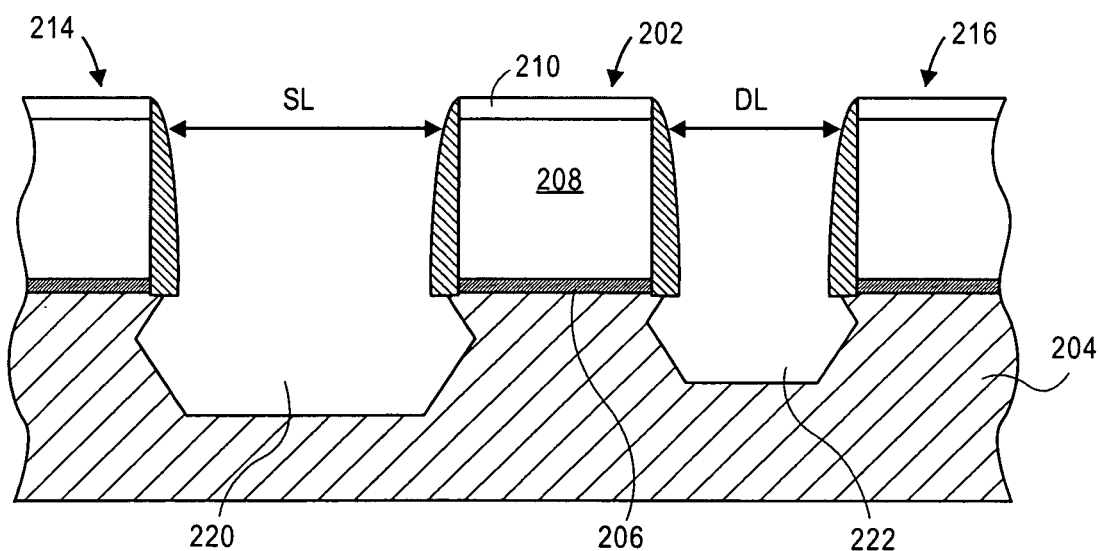

Next, as illustrated in FIG. 2B, a source side recess 220 is etched in substrate 204 on the source side of gate stack 202, and a drain side recess 222 is formed in substrate 204 on the drain side of the gate stack 202. Source side recess 220 is formed deeper into substrate 204 than is drain side recess 222. In an embodiment of the present invention, source side recess 220 and drain side recess 222 are simultaneously etched into substrate 204. Because of the wider opening (SL) created on the source side between source side structure 214 and sacrificial gate stack 202, as compared to the opening (DL) created on the drain side between drain side structure 216 and sacrificial gate stack 202, the etching process will induce a deeper and wider undercut of the source region than in the drain region. The differential etching will result in a deep source side recess and a narrow drain side recess. In an embodiment, the difference in SL versus DL is sufficient to tailor the etching process used to create the undercut source and drain regions. For example, in a particular embodiment, because of the smaller DL, etch by-products are inhibited from being removed from the drain side during the etch process which slows the etch rate on the drain side. By contrast, the wider opening (SL) allows for rapid etch by-product removal, such that the etch rate of the etch process is not substantially inhibited on the source side throughout the duration of the etch process. In this way, different dimensions are created for the source recess relative to the drain recess during a same etch process.

In an embodiment of the present invention, source side recess 220 is between 20-70% deeper than drain side recess 222 as measured from the surface of semiconductor substrate 204 upon which gate stack 202 is formed. In an embodiment of the present invention, a dry etch process is used to etch source side recess 220 and drain side recess 222. In embodiments of the present invention, a dry etch process may be followed by a wet etch process in order to create recesses 220 and 222 with facets 224 as illustrated in FIG. 2B. In an embodiment of the present invention, the etching process creates recesses 220 and 222 which undercut sacrificial gate stack 202 as illustrated in FIG. 2B.

Figure 2C:
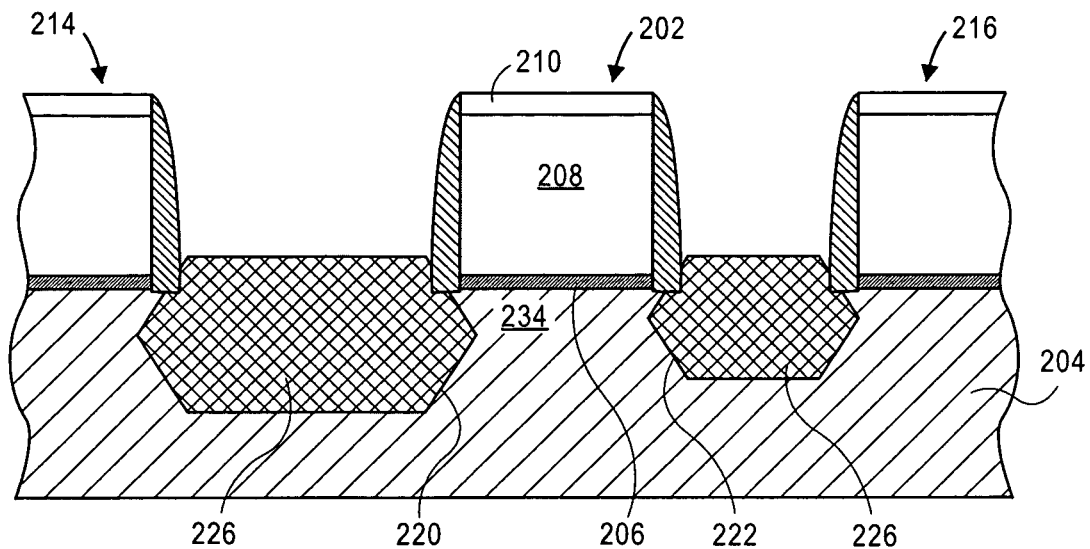

Next, as illustrated in FIG. 2C a semiconductor material 226 is deposited into source side recess 220 and drain side recess 222 in order to create a source region 230 and a drain region 232. In an embodiment of the present invention, semiconductor material 226 has a lattice constant which is different than the lattice constant of substrate 204 in order to create a stress or strain in channel region 234 of substrate 204. Since source side recess 220 is formed deeper into substrate 204 than is drain side recess 222, semiconductor material 226 creates a greater amount of strain in channel region 234 adjacent to the source region 230 than is created in channel region 234 adjacent to the drain region by semiconductor material 226 in shallow drain side recess 222.

In an embodiment, semiconductor material 226 is deposited to completely fill source side recess 220 and drain side recess 222. In another embodiment, semiconductor material 226 is deposited to a thickness so that a portion of semiconductor material 226 extends above the surface of substrate 204 upon which sacrificial gate stack 202 is formed in order to create raised source region 230 and a raised drain region 232 in order to improve contact resistance of the device. In an embodiment of the present invention, semiconductor material 226 is selectively epitaxially deposited by, for example, metal organic chemical vapor deposition (MOCVD) so that it forms only on substrate 204 in recesses 220 and 222 and not on sacrificial gate stack 202, sidewall spacers 212, source side structure 214, or drain side structure 216. Semiconductor material 226 may be in situ doped with p type impurities when forming a p type device or n type impurities when forming an n type device. In a particular embodiment of the present invention, semiconductor material is silicon germanium comprising at least 10% germanium and in other embodiments at least 30% germanium.

Figure 2D:
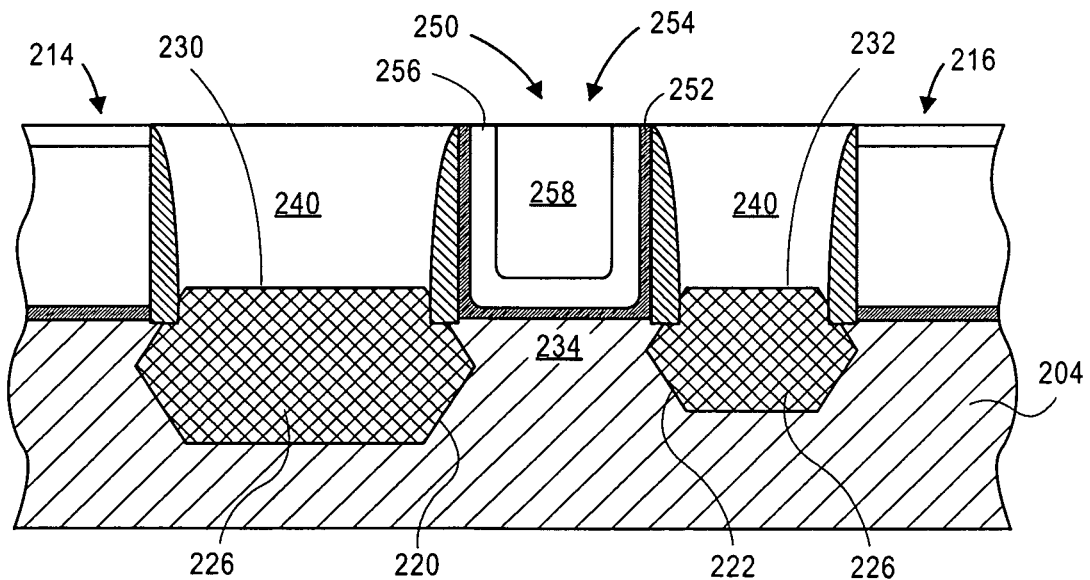

Next, as illustrated in FIG. 2D, an insulating layer 240 may be formed in the opening between sacrificial gate stack 202 and source side structure 214 and between sacrificial gate stack 202 and drain side structure 216. In an embodiment of the present invention, an insulating layer, such as a silicon oxide layer, a carbon doped oxide layer or a silicon nitride layer is blanket deposited over source region 230 and drain region 232, as well as over sacrificial gate stack 202, source side structure 214 and drain side structure 216. Insulating layer 240 may then be planarized by, for example, chemical mechanical polishing to create a top surface which is substantially coplanar with the top surface of sacrificial gate stack 202 as shown in FIG. 2D. Insulating layer 240 may comprise a first interlayer dielectric (e.g., ILD0) of a backend interconnect structure utilized to interconnect together various semiconductor devices formed on substrate 204 into functional circuits.

Next, sacrificial gate stack 202 may be removed and replaced with a gate stack 250. In an embodiment of the present invention, sacrificial gate stack 202 is removed by etching. In an embodiment, sacrificial gate dielectric 206 provides an etch stop layer for an etching process used to remove sacrificial gate electrode 208. By using the sacrificial gate dielectric 206 as an etch stop layer, the pristine nature of the underlying channel region may be protected from a harsh etching process used to remove the sacrificial gate electrode 208. A second etching process may then be performed to remove sacrificial gate dielectric 206.

Once sacrificial gate stack 202 has been removed, a permanent gate stack 250 for the semiconductor device may be formed. In an embodiment, gate stack 250 includes a gate dielectric 252 formed directly on channel region 234 of substrate 204. In an embodiment of the present invention, gate dielectric 252 is a high k dielectric layer formed by, for example, atomic layer deposition (ALD). In an embodiment of the present invention, the high k dielectric 252 is formed on the channel region 234 of substrate 204 as well as along the sidewalls of spacers 212 resulting in a U-shaped gate dielectric layer as illustrated in FIG. 2D. In embodiments, a thin interface oxide layer may be formed between high k gate dielectric layer 252 and substrate 204. Additionally, in an embodiment of the present invention, gate electrode 254 may include a work function metal 256 and a fill metal 258. In an embodiment, work function metal 256 is conformally or substantially conformally formed on gate dielectric layer 252 resulting in a U-shaped work function metal 256. A fill metal 258 may then be formed on the work function metal 256 as illustrated in FIG. 2D. It is to be appreciated that although the above process flow is described in association with a replacement gate process or gate last process, in other embodiments the permanent gate stack materials are formed prior to forming the source and drain recesses. Although not depicted in FIG. 2D, it is to be appreciated that the source side structure 214 and the drain side structure 216 may also be subjected to a replacement gate process as a consequence of being exposed during the replacement gate process used to form permanent gate stack 250. However, in other embodiments, the source side structure 214 and the drain side structure 216 are not subjected to a replacement gate process, as depicted in FIG. 2D.

Figure 3A:
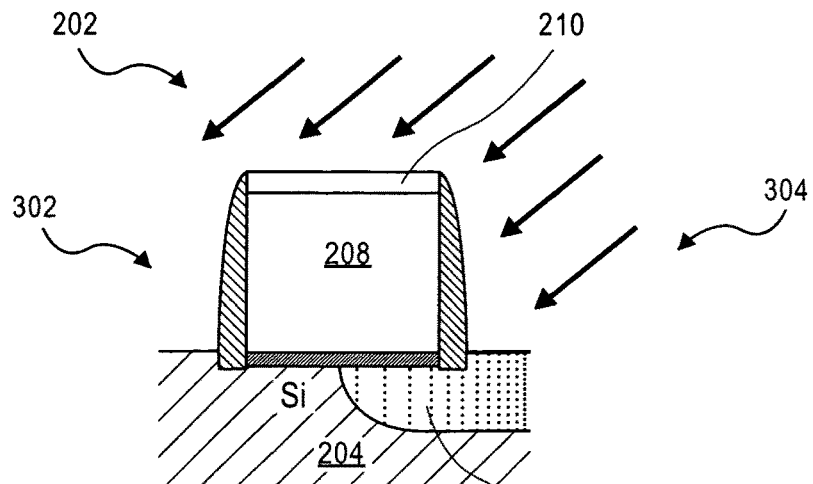
FIGS. 3A-3C illustrates a method of forming a dual VT semiconductor device an asymmetric channel in accordance with embodiments of the present invention.
Figure 3B:
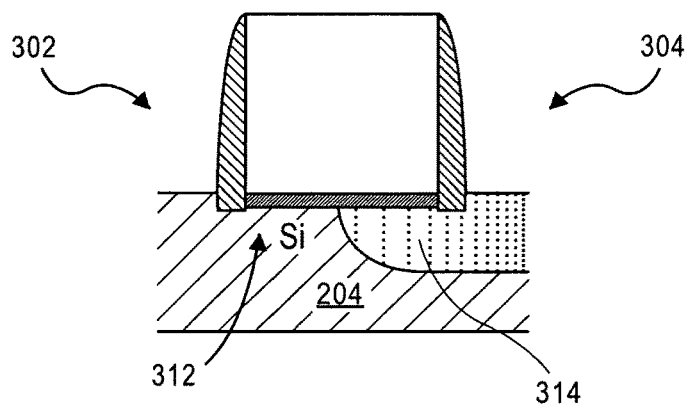
Figure 3C:
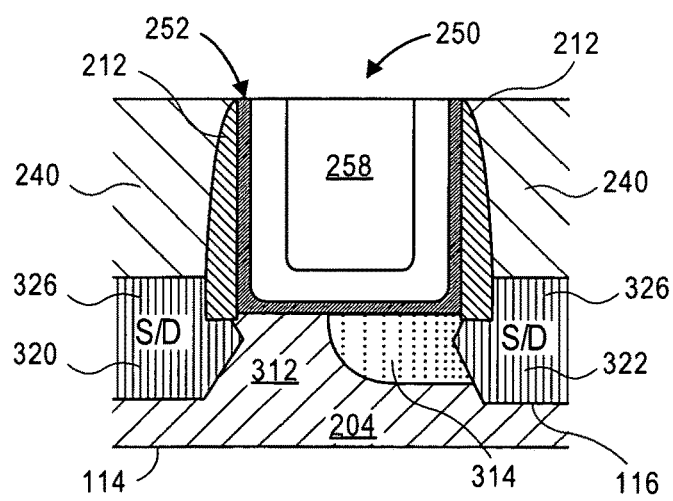

FIGS. 3A-3C illustrates a method of forming a dual VT channel semiconductor device having an asymmetric channel. The process may be begin by forming a sacrificial gate stack 202 on a substrate 204 as described above. Sacrificial gate stack 202 defines a source side 302 and a drain side 304 in substrate 204. A plurality of atoms may be placed into substrate 204 on the drain side 304 of sacrificial gate stack 202 and beneath gate stack 202 adjacent to the source side 304 as illustrated in FIG. 3A. In an embodiment, atoms placed into substrate 204 are band gap lowering atoms that will lower the band gap of substrate 204 upon substitution. In an embodiment of the present invention, the type and amount of atoms that are placed in substrate 204 near the drain side are band gap lowering atoms that are sufficient to, upon substitution, lower the band gap of substrate 204 by at least 50 meV and in another embodiment, by at least 100 meV. In an embodiment of the present invention, germanium atoms are placed into a silicon monocrystalline substrate. In an embodiment of the present invention, germanium atoms are ion implanted using a tilt angled germanium implantation process to dope a region 306 of the channel close to the drain with germanium atoms. In an embodiment of the present invention, the implant angle is between 30-60° from a direction normal to the substrate. It is to be appreciated that by using such an angled implant, gate stack 202 acts to block or shadow atoms from being placed in the source side of the channel region to leave the source side of the channel region essentially free from the implanted atoms. In an embodiment of the present invention, a sufficient number of atoms are placed into a drain side of the channel of a monocrystalline silicon substrate 204 in order to create a silicon germanium semiconductor region having between 10-30 atomic percent germanium. Although the above description highlights the use of ion implantation to dope the region 306, it is to be appreciated that other processes may be used, such as solid state diffusion.

After the band gap lowering atoms have been placed into the substrate on the drain side and beneath the gate stack on the drain side of the channel, substrate 204 may be subjected to a high temperature anneal to recrystallize the semiconductor substrate 204 and to substitute germanium atoms for silicon atoms within the silicon lattice. In an embodiment of the present invention, the anneal may be a high temperature anneal between 600-1200° C. in an $N_2$ ambient. The annealing process removes defects and creates a perfect or essentially perfect crystal lattice layer. Accordingly, an asymmetric channel has been created which includes a first channel portion 312 adjacent to the source side 302 which consists of a portion of the semiconductor substrate 204, and a second semiconductor channel portion 314 adjacent to the drain side 304 which has a lower band gap than does the first channel portion 312 adjacent to the source side.

Next, as illustrated in FIG. 3C, a source region 320 and a drain region 322 may be formed. In an embodiment, the source region 320 and drain region 322 are formed by ion implanting dopants into the silicon substrate 204. In another embodiment, source region 320 and drain region 322 are formed by etching recesses 324 into substrate 204 on opposite sides of gate stack 202 and then filling the recesses 324 with a semiconductor material 326. In an embodiment, recesses 324 extend the same depth into substrate 204 as well as extend the same distance laterally. Next, as is also illustrated in FIG. 3C, an insulating layer 240 may be formed on substrate 204 and a permanent gate stack 250 may be formed as described with respect to FIG. 2D.

Figure 4A:
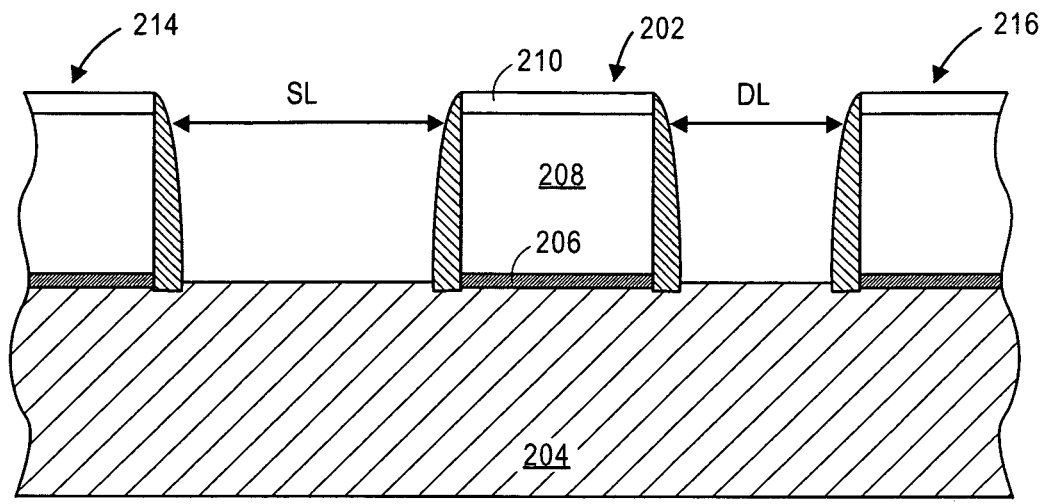
FIGS. 4A-4D illustrates a method of forming a dual VT channel semiconductor device having asymmetric source and drain regions and an asymmetric channel region.
Figure 4B:
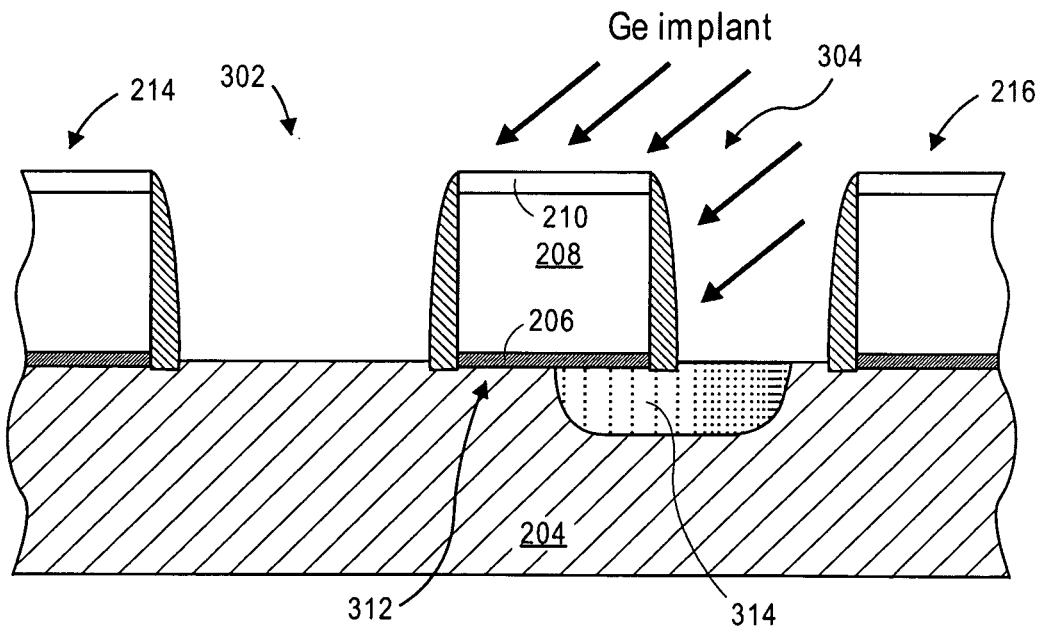

FIGS. 4A-4D illustrate a method of forming a dual VT device having both asymmetric source and drain regions as well as an asymmetric channel region. In accordance with an embodiment of the present invention and as illustrated in FIG. 4A, the process may begin by forming a sacrificial gate stack 202 on a substrate 204 as well as source side structure 214 and drain side structure 216 as is described with respect to FIG. 2A. Next, a band gap lowering dopant may be inserted into the substrate 204 as illustrated in FIG. 4B and as described with respect to FIGS. 3A and 3B to create a channel region which has a high band gap portion 312 near the source side 302 and a lower band gap portion 314 near the drain side 304.

Figure 4C:
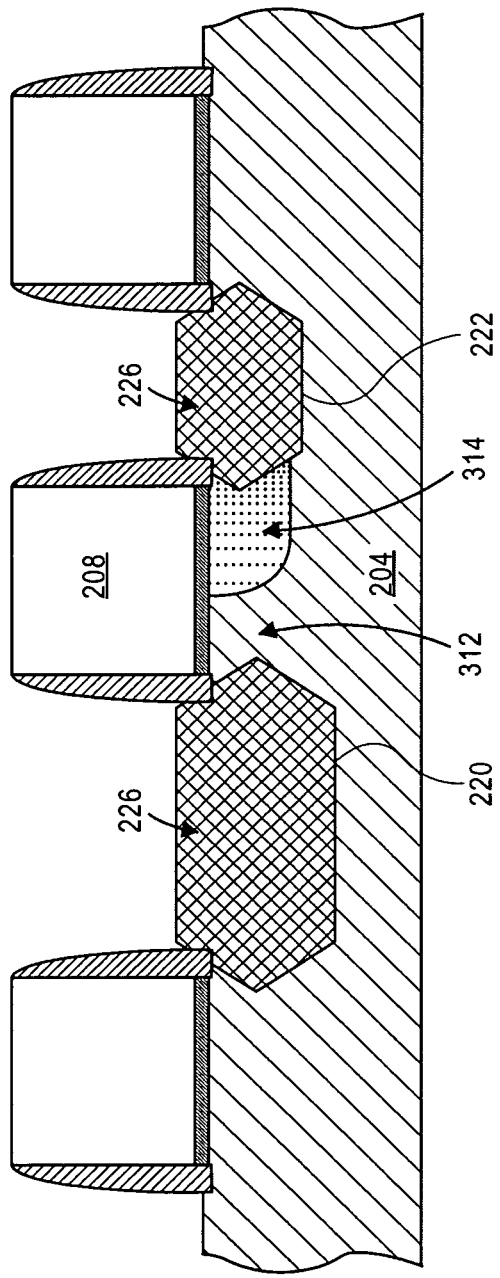

Next, as illustrated in FIG. 4C, a deep source recess 220 and a shallower recess 222 may be formed in substrate 204 and then filled with a semiconductor material 226 as described with respect to FIG. 2B and FIG. 2C to form source region 230 and drain region 232 which create differential strain on the channel region of the device, wherein a higher strain is provided on the source side of the channel and a lower strain is provided on the drain side of the channel.

Figure 4D:
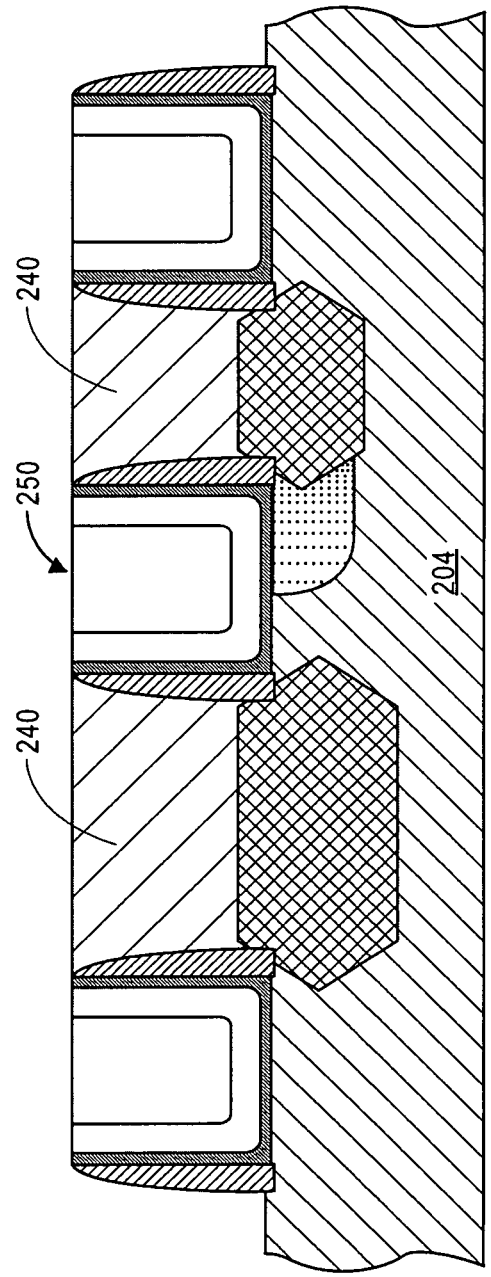

Next, as illustrated in FIG. 4D, an insulating layer 240 may be formed over the substrate and a permanent gate stack 250 may be formed over the channel region of the substrate 204 in a manner described in association with FIG. 2D. In this way, a dual VT device having asymmetric source and drain regions as well as an asymmetric channel may be formed. It is to be appreciated that the source side structure 214 and the drain side structure 216 may also be subjected to a replacement gate process as a consequence of being exposed during the replacement gate process used to form permanent gate stack 250, as is illustrated in FIG. 4D.

Figures 5A, 5B:
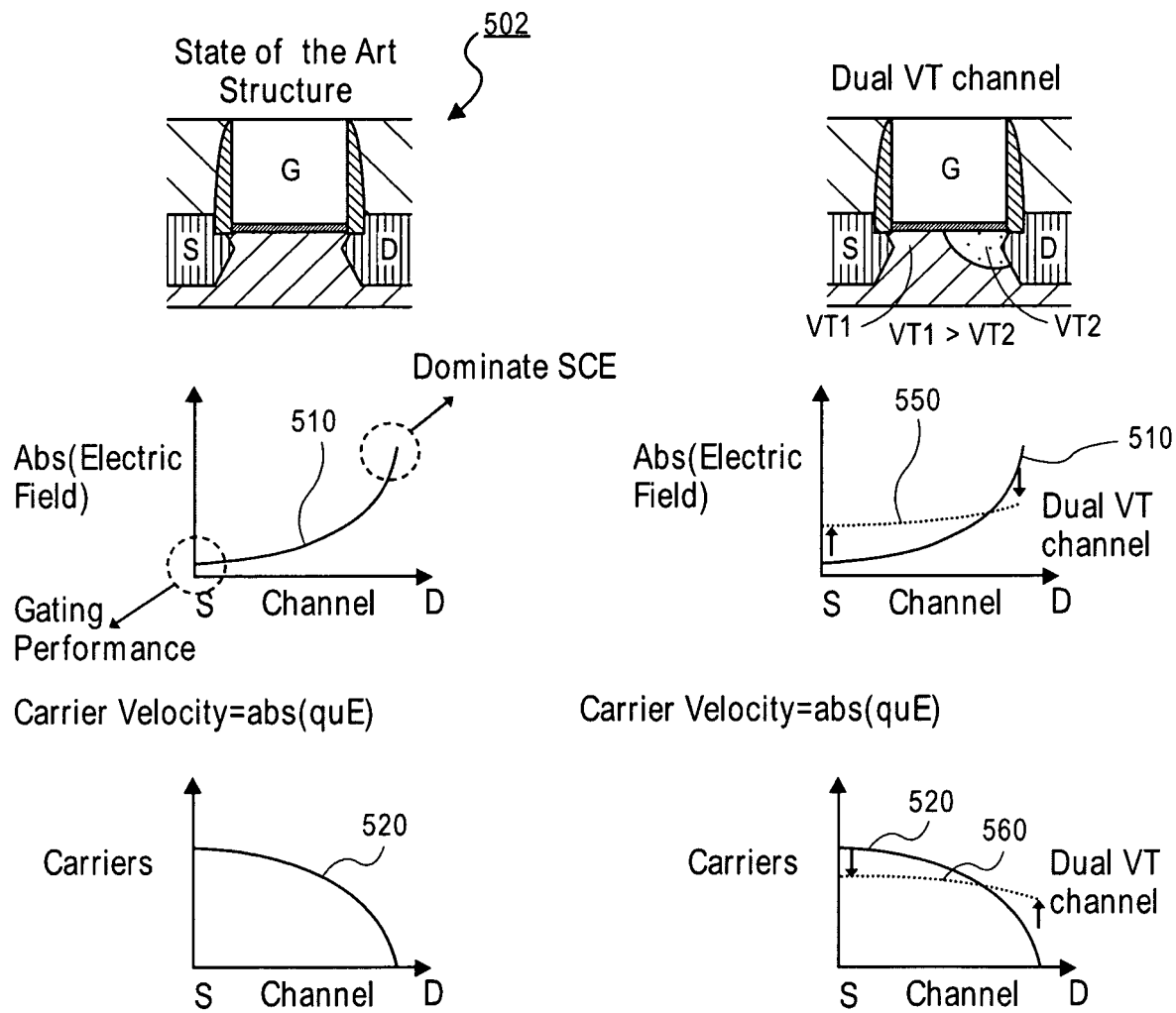
FIG. 5A illustrates the electric characteristics of a state of the art semiconductor device.
FIG. 5B illustrates the electrical characteristics of a dual VT channel device in accordance with embodiments of the present invention.

FIG. 5A illustrates the electrical performance of state of the art MOS device 502 which has symmetric source and drain regions as well as a channel region formed from a single semiconductor material. Plot 510 of FIG. 5A illustrates how the electric field exponentially grows from the source through the channel to the drain region for state of the art device 502. Plot 520 illustrates the carrier number from the source to the drain region for a state of the art device 502.

Plot 550 illustrates how the electric field of the dual VT channel device in accordance with embodiments of the present invention varies across the channel from the source to the drain region. As illustrated in plot 550, the dual VT channel device has a much more uniform electric field across the channel of the device. Plot 560 illustrates how the number of carriers for a dual VT channel device of embodiments of the present invention vary from the source to the drain region. As illustrated by plot 560, the dual VT channel device of the present invention provides a much more uniform or consistent number of carriers across the channel of the device.

Figure 6:
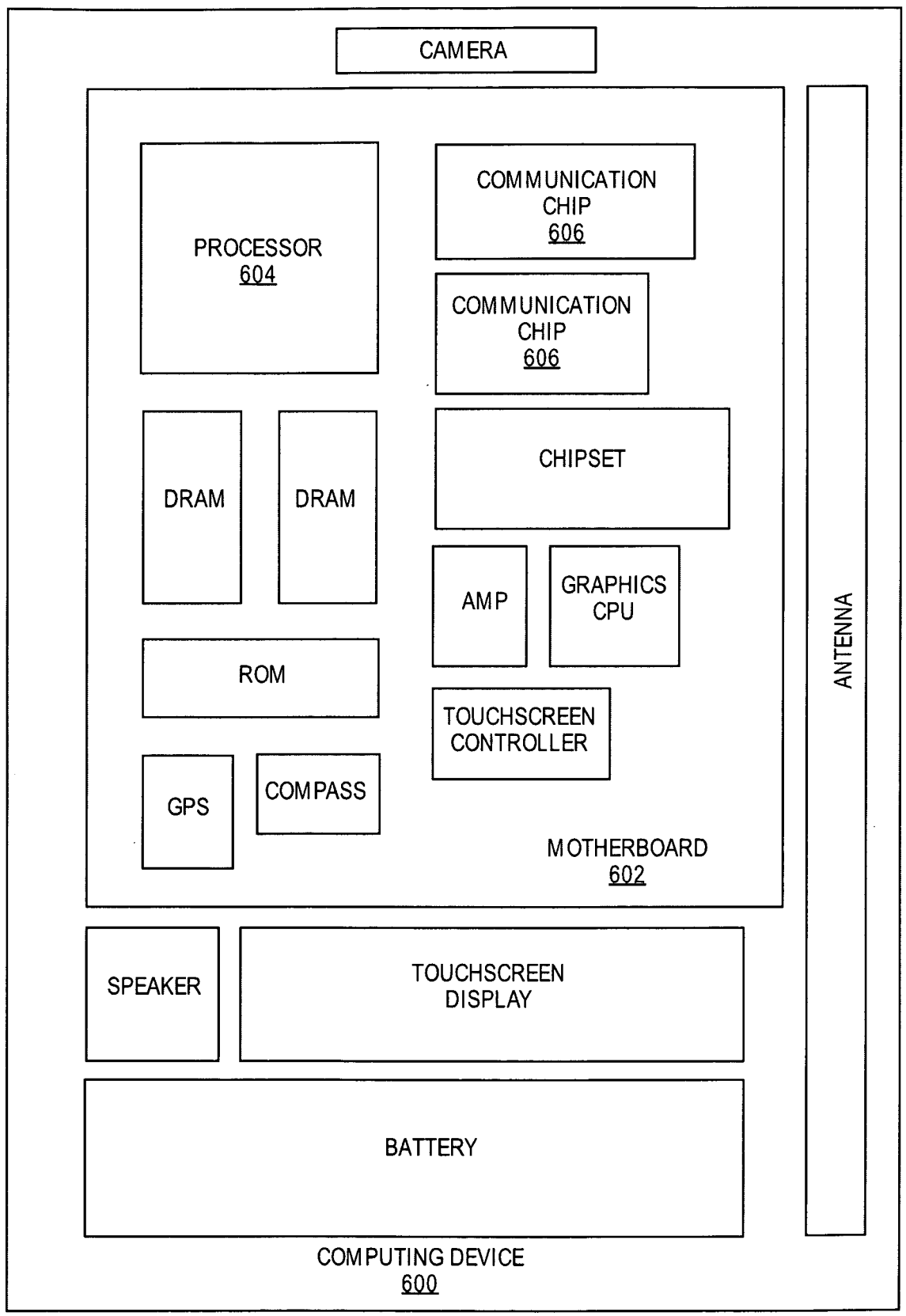
FIG. 6 illustrates a computing device in accordance with one implementation of an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as field effect transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as FET transistors built in accordance with implementations of the invention.

In further implementations, another component housed within the computing device 300 may contain an integrated circuit die that includes one or more devices, such as FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
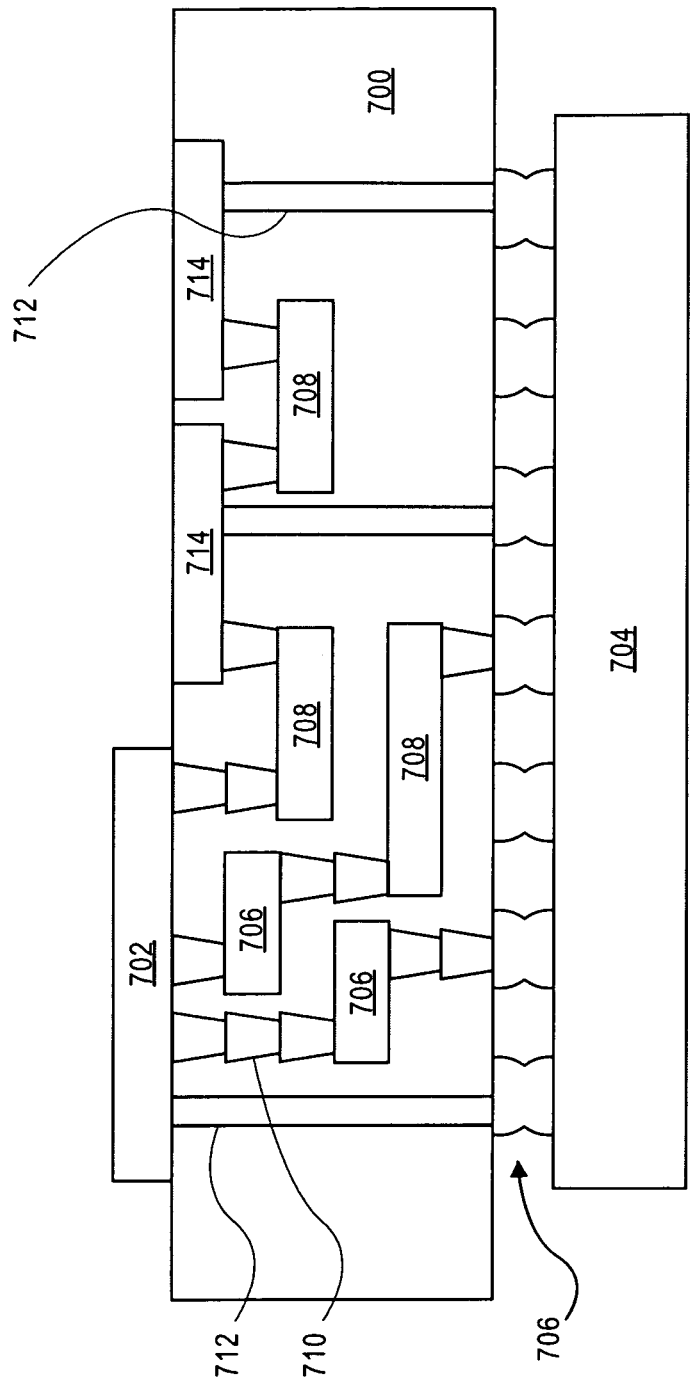
FIG. 7 is an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 400 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 402/404 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

We claim:

1. A semiconductor device comprising:
   a gate stack disposed on a substrate, the substrate having a first lattice constant, the gate stack having a gate electrode;
   a source region and a drain region formed on opposite sides of the gate stack;
   a channel region disposed beneath the gate stack and between the source region and the drain region, wherein the source region is disposed in a first recess having a first depth and the drain region disposed in a second recess having a second depth, the first recess deeper than the second recess, wherein a portion of the first recess is beneath the gate electrode of the gate stack, and a portion of the second recess is beneath the gate electrode of the gate stack, wherein the portion of the first recess extends laterally further beneath the gate electrode than the portion of the second recess, and wherein the portion of the first recess does not vertically overlap the portion of the second recess, and
   wherein a semiconductor material having a second lattice constant different than the first lattice constant is disposed in the first recess and the second recess; and
   a source side structure disposed over the substrate wherein the source side structure is spaced apart from the gate stack by a first distance, and a drain side structure disposed on the substrate, wherein the drain side structure is spaced apart from the stack by a second distance, wherein the first distance is greater than the second distance.

2. The semiconductor device of claim 1 wherein the first depth is at least 20% greater than the second depth.

3. The semiconductor device of claim 2 wherein the first depth is between 20-70% greater than the second depth.

4. The semiconductor device of claim 1 wherein the semiconductor substrate is a silicon monocrystalline substrate and wherein said semiconductor material is silicon germanium.

5. The semiconductor device of claim 1 wherein the channel region comprises a first semiconductor portion having a first band gap adjacent to the source region and a second semiconductor portion having a second band gap adjacent to the drain region, wherein the second band gap is smaller than the first band gap.

6. The semiconductor device of claim 1 wherein the channel region has a channel length and wherein the second portion has a length between 20-50% of the channel length.

7. A method of forming semiconductor device comprising:
   forming a first gate stack on a semiconductor substrate having a first lattice constant, the gate stack having a gate electrode;
   forming a first recess on a source side of the gate stack to a first depth and forming a second recess on the drain side of the gate stack to a second depth, wherein the first depth is greater than the second depth, wherein a portion of the first recess is beneath the gate electrode of the gate stack, and a portion of the second recess is beneath the gate electrode of the gate stack, wherein the portion of the first recess extends laterally further beneath the gate electrode than the portion of the second recess, and wherein the portion of the first recess does not vertically overlap the portion of the second recess;
   forming a semiconductor material in the first recess to form a source region and forming the semiconductor material in the second recess to form a drain region, wherein semiconductor material has a second lattice constant, wherein the second lattice constant is different than the first lattice constant; and
   forming a second gate stack on the source side of the first gate stack and forming a third gate stack on the drain side of the first gate stack, wherein the second gate stack is separated from the first gate stack by a first distance and wherein the third gate stack is separated from the first gate stack by a second distance, wherein the first distance is greater than the second distance, wherein forming the first recess and forming the second recess comprise simultaneously etching the semiconductor substrate between the first and second gate stacks and the semiconductor substrate between the first and third gate stacks.

8. The method of claim 7 further comprising placing atoms into the substrate beneath the gate stack adjacent to the drain side of the device.

9. The method of claim 8 wherein the atoms are placed in the substrate prior to forming the first recess and the second recess.

10. The method of claim 7 wherein the atoms reduce the band gap of the semiconductor substrate beneath the gate stack.

\* \* \* \* \*